US012713526B2

(12) United States Patent
Shimizu

(10) Patent No.: US 12,713,526 B2

(45) Date of Patent: Aug. 18, 2026

(54) WIRING BOARD AND MANUFACTURING METHOD FOR THE SAME

(71) Applicant: KYOCERA Corporation, Kyoto (JP)

(72) Inventor: Noriyuki Shimizu, Fukuchiyama (JP)

(73) Assignee: KYOCERA CORPORATION, Kyoto (JP)

( * ) Notice: Subject to any disclaimer, the term of this patent is extended or adjusted under 35 U.S.C. 154(b) by 205 days.

(21) Appl. No.: 18/703,638

(22) PCT Filed: Oct. 25, 2022

(86) PCT No.: PCT/JP2022/039641

§ 371 (c)(1),
(2) Date: Apr. 22, 2024

(87) PCT Pub. No.: WO2023/074661

PCT Pub. Date: May 4, 2023

(65) Prior Publication Data

US 2024/0422900 A1 Dec. 19, 2024

(30) Foreign Application Priority Data

Oct. 28, 2021 (JP) ................................ 2121-176324

(51) Int. Cl.
*H05K 1/02* (2006.01)

(52) U.S. Cl.
CPC . *H05K 1/0298* (2013.01); *H05K 2201/09236* (2013.01); *H05K 2201/095* (2013.01); *H05K 2201/09727* (2013.01)

(58) Field of Classification Search
CPC ....... H05K 1/0298; H05K 2201/09236; H05K 2201/095; H05K 2201/09727; H05K 3/18; H05K 3/188; H05K 1/09; H05K 3/0011
USPC ......................... 174/250, 260, 251, 261, 255
See application file for complete search history.

(56) References Cited

U.S. PATENT DOCUMENTS 8,745,860 B2 * 6/2014 Inui ...................... H05K 1/0206 174/260
9,564,392 B2 * 2/2017 Furutani ............. H05K 1/0313
9,655,248 B2 * 5/2017 Narumi .................. H05K 1/185
10,172,235 B1 * 1/2019 Harazono ............. H05K 1/024
(Continued)

FOREIGN PATENT DOCUMENTS

JP 2001-060589 A 3/2001
JP 2004-149926 A 5/2004
JP 2005-183452 A 7/2005

*Primary Examiner* — Angel R Estrada
(74) *Attorney, Agent, or Firm* — Volpe Koenig

(57) ABSTRACT

A wiring board according to the present disclosure includes an insulation layer, a groove located at an upper surface of the insulation layer, a recessed portion located at the upper surface of the insulation layer and having a width wider than the groove, an underlying metal layer located at an inner surface of the groove and an inner surface of the recessed portion, a first wiring conductor located on the underlying metal layer to fill the groove, and a second wiring conductor located on the underlying metal layer to fill the recessed portion and having a width wider than the first wiring conductor. The second wiring conductor includes a first portion and a second portion located adjacent to and integrally with the first portion. A plurality of voids are located at a boundary between the first portion and the second portion.

9 Claims, 13 Drawing Sheets

(56) References Cited

U.S. PATENT DOCUMENTS

2016/0381793 A1* 12/2016 Yasuda ................ H05K 3/4682
174/251

* cited by examiner

WIRING BOARD AND MANUFACTURING METHOD FOR THE SAME

TECHNICAL FIELD

The present disclosure relates to a wiring board and a manufacturing method for the wiring board.

BACKGROUND OF INVENTION

In known art, a semi-additive method has been used as a method for forming a wiring conductor in a wiring board. The semi-additive method is a method for forming a wiring conductor by the following procedure. First, a thin underlying metal layer is formed at an exposed surface of an insulation layer by an electroless plating method, a sputtering method, or the like. Subsequently, a plating resist layer having an opening portion corresponding to a pattern of the wiring conductor is formed on the underlying metal layer. Subsequently, an electrolytic plating layer is formed on the underlying metal layer exposed in the opening portion of the plating resist layer. Subsequently, the plating resist layer is peeled off and removed, and, finally, a portion of the underlying metal layer not covered with the electrolytic plating layer is removed by etching.

In wiring boards, size reduction of wiring conductors has been progressing. For example, wiring conductors each having a width of 15 μm or less and an interval between adjacent wiring conductors of 15 μm or less has been required recently. When the width of each of the wiring conductors is as narrow as 15 μm or less, for example, a bonding area between the insulation layer and the wiring conductor via the underlying metal layer becomes small. As a result, the wiring conductor is easily peeled off from the insulation layer. The electrical insulation reliability between the wiring conductors adjacent to each other deteriorates.

As described in Patent Document 1, a method for forming a wiring conductor including an underlying metal layer and an electrolytic plating layer remaining in a groove has been proposed. First, a groove corresponding to a pattern of a wiring conductor is formed at a surface of an insulation layer at a predetermined depth by a laser machining process. Subsequently, a thin underlying metal layer is formed at the surface of the insulation layer including an inner wall of the groove by an electroless plating method, a sputtering method, or the like. Subsequently, an electrolytic plating layer having a thickness large enough to fill the groove is formed on the underlying metal layer. Finally, the underlying metal layer and the electrolytic plating layer on the insulation layer are polished and removed by chemical mechanical polishing.

According to this method, a groove for the wiring conductor having a relatively narrow width (for example, 15 μm or less) is filled well with the electrolytic plating layer. However, a groove for the wiring conductor having a relatively wide width (for example, 150 μm or more) is difficult to be filled well with the electrolytic plating layer. As a result, in the wiring conductor having the wide width, the upper surface of the wiring conductor is significantly recessed and the flatness thereof becomes poor. If the thickness of the electrolytic plating layer is further increased in order to eliminate the recess, stress generated when forming the electrolytic plating layer is increased. Thus, stress significantly acts, via the underlying metal layer, between the inner walls of the groove for the wiring conductor having the wide width, and the wiring conductor having the wide width becomes likely to peel off.

CITATION LIST

Patent Literature

Patent Document 1: JP 2004-149926 A

SUMMARY

Solution to Problem

A wiring board according to the present disclosure includes an insulation layer, a groove located at an upper surface of the insulation layer, a recessed portion located at the upper surface of the insulation layer and having a width wider than the groove, an underlying metal layer located at an inner surface of the groove and an inner surface of the recessed portion, a first wiring conductor located on the underlying metal layer to fill the groove, and a second wiring conductor located on the underlying metal layer to fill the recessed portion and having a width wider than the first wiring conductor. The second wiring conductor includes a first portion and a second portion located adjacent to and integrally with the first portion. A plurality of voids are located at a boundary between the first portion and the second portion.

In a manufacturing method for a wiring board according to the present disclosure, the manufacturing method includes forming a groove and a recessed portion having a width wider than the groove, at an upper surface of an insulation layer, forming an underlying metal layer at the upper surface of the insulation layer, an inner surface of the groove, and an inner surface of the recessed portion, forming at least one plating resist having a width narrower than the width of the recessed portion, on the underlying metal layer in the recessed portion, forming a first electrolytic plating layer on the underlying metal layer exposed from the plating resist, removing the plating resist from on top of the underlying metal layer, forming a second electrolytic plating layer on the first electrolytic plating layer and on the underlying metal layer, and removing portions of the first electrolytic plating layer, the second electrolytic plating layer, and the underlying metal layer to form a first wiring conductor that fills the groove and is made of a first electrolytic plating metal derived from the first electrolytic plating layer or a second electrolytic plating metal derived from the second electrolytic plating layer, and a second wiring conductor that fills the recessed portion and is made of the first electrolytic plating metal derived from the first electrolytic plating layer and the second electrolytic plating metal derived from the second electrolytic plating layer.

DESCRIPTION OF EMBODIMENTS

As described above, in the known method for forming the wiring conductor including the underlying metal layer and the electrolytic plating layer remaining in the groove, stress significantly acts, via the underlying metal layer, between the inner walls of the groove for the wiring conductor having the wide width, and the wiring conductor having the wide width becomes likely to peel off. Therefore, there is demand for a wiring board in which a wiring conductor having a wide width is unlikely to peel off.

In a wiring board according to the present disclosure, a second wiring conductor having a wide width includes a first portion and a second portion located adjacent to and integrally with the first portion, and a plurality of voids are located at a boundary between the first portion and the second portion. Thus, stress generated between the second wiring conductor and an insulation layer, and stress generated in the second wiring conductor are dispersed and alleviated at the boundary, between the first portion and the second portion, at which the voids are located. As a result, in the wiring board according to the present disclosure, peeling of the second wiring conductor can be reduced.

According to a manufacturing method for the wiring board according to the present disclosure, stress generated when forming a first electrolytic plating layer and when forming a second electrolytic plating layer is dispersed by the above-described step. As a result, according to the manufacturing method for the wiring board according to the present disclosure, a wiring board is obtained in which the peeling of the second wiring conductor formed in a recessed portion is reduced.

Figure 1:
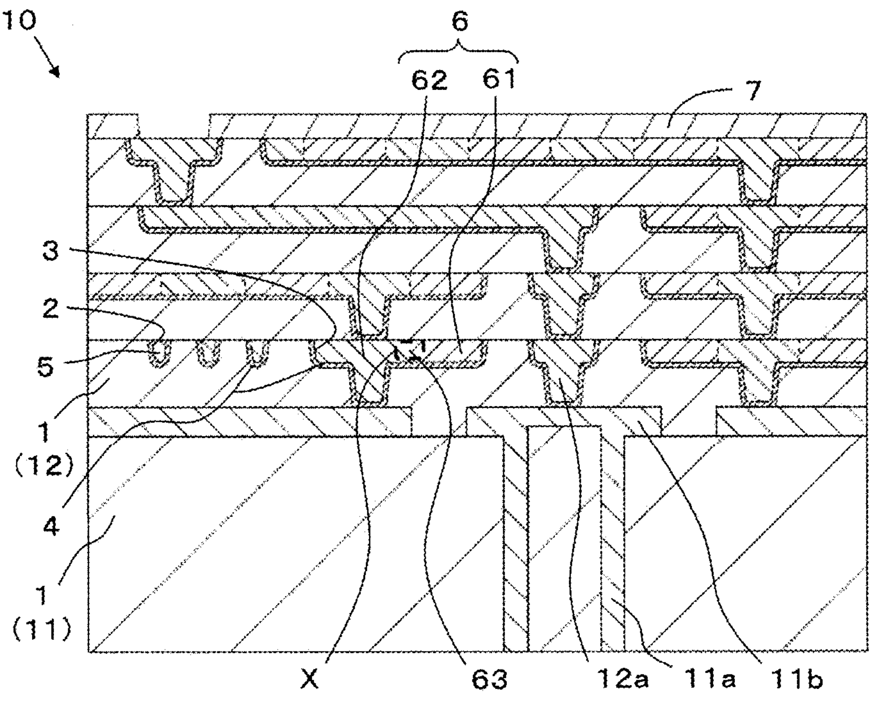
FIG. 1 is an explanatory diagram illustrating a cross section of a wiring board according to an embodiment of the present disclosure.

The wiring board according to the present disclosure will be described with reference to FIGS. 1 and 2. FIG. 1 is an explanatory diagram illustrating a cross section of the wiring board according to the embodiment of the present disclosure. A wiring board 10 according to the embodiment includes insulation layers 1 (11, 12), a first wiring conductor 5, and a second wiring conductor 6. In the wiring board 10 according to the embodiment, the insulation layer 1 (11) corresponds to a core insulation layer 11, and the insulation layer 1 (12) corresponds to a build-up insulation layer 12. In the wiring board 10 according to the embodiment, a mode will be described in which the build-up insulation layer 12 includes the first wiring conductor 5 and the second wiring conductor 6.

The core insulation layer 11 is made of a resin such as an epoxy resin, a bismaleimide-triazine resin, a polyimide resin, a polyphenylene ether resin, or a liquid crystal polymer. These resins may be used alone or in a combination of two or more. The core insulation layer 11 may contain a reinforcing material such as glass cloth, and may further contain insulation particles dispersed therein. The insulation particles are not limited, and examples thereof may include inorganic insulation fillers made of silica, alumina, barium sulfate, talc, clay, glass, calcium carbonate, titanium oxide, and the like, for example. The thickness of the core insulation layer 11 is not particularly limited, and is, for example, in a range from 0.1 mm to 2.0 mm.

The core insulation layer 11 includes a through-hole conductor 11*a* for electrically connecting conductor layers 11*b* on upper and lower surfaces of the core insulation layer 11. The through-hole conductor 11*a* is located in a through hole penetrating the upper and lower surfaces of the core insulation layer 11. The through-hole conductor 11*a* is made of a metal plating such as copper plating, for example. The through-hole conductor 11*a* is connected to the conductor layers 11*b* on both surfaces of the core insulation layer 11. The through-hole conductor 11*a* may be formed only at an inner wall surface of the through hole, or the through hole may be filled with the through-hole conductor 11*a*.

In the same and/or similar manner as the core insulation layer 11, the build-up insulation layer 12 is also made of a resin such as an epoxy resin, a bismaleimide-triazine resin, a polyimide resin, a polyphenylene ether resin, or a liquid crystal polymer. These resins may be used alone or in a combination of two or more. The core insulation layer 11 and the build-up insulation layer 12 may be formed of the same resin or different resins. The build-up insulation layer 12 may contain a reinforcing material such as glass cloth, and may further contain insulation particles dispersed therein. The insulation particles are not limited, and examples thereof may include inorganic insulation fillers made of silica, alumina, barium sulfate, talc, clay, glass, calcium carbonate, titanium oxide, and the like, for example. The thickness of the build-up insulation layer 12 is not particularly limited, and is, for example, in a range from 10 μm to 50 μm.

The build-up insulation layer 12 includes a via-hole conductor 12*a* for electrically connecting conductor layers located on upper and lower surfaces of the build-up insulation layer 12. The via-hole conductor 12*a* is located in a via hole penetrating the upper and lower surfaces of the build-up insulation layer 12. For example, the via-hole conductor 12*a* is formed at the same time as when forming the first wiring conductor 5 and the second wiring conductor 6. The via-hole conductor 12*a* may be formed only at an inner wall surface of the via hole, or the via hole may be filled with the via-hole conductor 12*a*.

A groove 2 and a recessed portion 3 are located at the upper surface of the build-up insulation layer 12. An underlying metal layer 4 is located at inner surfaces of the groove 2 and the recessed portion 3. The underlying metal layer 4 serves as a base for the first wiring conductor 5 and the second wiring conductor 6. The underlying metal layer 4 is made of, for example, a metal such as copper. The underlying metal layer 4 has a thickness in a range from 0.1 μm to 0.5 μm, for example. The presence of the underlying metal layer 4 improves the adhesiveness of the first wiring conductor 5 and the second wiring conductor 6.

The groove 2 is filled with the first wiring conductor 5. The width of the first wiring conductor 5 may be relatively narrow, and may be 15 μm or less, for example. The first wiring conductor 5 as described above functions as a signal wiring conductor, for example. The width of the groove 2 is appropriately set in accordance with the width of the first wiring conductor 5. The depth of the groove 2 is not limited as long as the groove 2 does not penetrate the build-up insulation layer 12. The depth of the groove 2 is preferably in a range from 10% to 50% of the thickness of the build-up insulation layer 12, for example. The state in which the groove 2 is filled with the first wiring conductor includes a case in which there is a void in the groove 2 caused by entrapment of air at the time of manufacturing, for example, and a case in which there is a void in the groove 2 due to non-adhesion of the underlying metal layer 4 or the first wiring conductor to a narrow portion of the groove 2.

The arithmetic mean roughness Ra of the inner surface of the groove 2 is not limited, and may be in a range from 50 nm to 100 nm, for example. When the arithmetic mean roughness Ra of the inner surface of the groove 2 is in a range from 50 nm to 100 nm, the underlying metal layer 4 is more firmly adhered, and peeling of the underlying metal layer 4 can be further reduced. The arithmetic mean roughness Ra of the surface of the underlying metal layer 4 located in the groove 2 is not limited, and may be in a range from 50 nm to 100 nm, for example. When the arithmetic mean roughness Ra of the surface of the underlying metal layer 4 located in the groove 2 is in the range from 50 nm to 100 nm, the first wiring conductor 5 is firmly adhered to the underlying metal layer 4, and peeling of the first wiring conductor 5 can be further reduced.

The arithmetic mean roughness Ra of the first wiring conductor 5 may be in a range from 50 nm to 100 nm corresponding to the arithmetic mean roughness Ra of the surface of the underlying metal layer 4. This roughness is smaller than the roughness of the side surface of the second wiring conductor 6, and when a high-frequency signal is transmitted to the first wiring conductor 5, the transmission loss can be further reduced.

The recessed portion 3 has a width wider than the groove 2. The recessed portion 3 is filled with the second wiring conductor 6. The width of the second wiring conductor 6 is wider than the width of the first wiring conductor 5, and may be 150 μm or more, for example. The second wiring conductor 6 as described above functions as a ground conductor layer, for example. The width of the recessed portion 3 is appropriately set in accordance with the width of the second wiring conductor 6. The depth of the recessed portion 3 is not limited as long as the recessed portion 3 does not penetrate the build-up insulation layer 12. The depth of the recessed portion 3 is preferably in a range from 10% to 50% of the thickness of the build-up insulation layer 12, for example. The state in which the recessed portion 3 is filled with the second wiring conductor also includes a case in which there is a void in the recessed portion 3 caused by entrapment of air at the time of manufacturing, for example, and a case in which there is a void in the recessed portion 3 due to non-adhesion of the underlying metal layer 4 or the second wiring conductor to a narrow portion of the recessed portion 3.

The second wiring conductor 6 includes a first portion 61 and a second portion 62, and the second portion 62 is located adjacent to and integrally with the first portion 61. The first portion 61 is made of, for example, a first electrolytic plating metal, and examples of the metal include copper. On the other hand, the second portion 62 is made of, for example, a second electrolytic plating metal, and examples of the metal include copper. Even when the first portion 61 and the second portion 62 are made of the same metal (for example, copper), they are treated as separate portions in the present specification.

Figure 2:
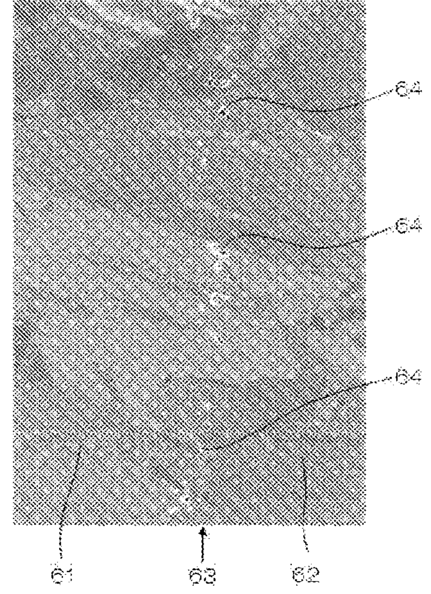
FIG. 2 is a photograph obtained by an electron microscope showing a region X illustrated in FIG. 1.

Although a boundary 63 between the first portion 61 and the second portion 62 is illustrated in FIG. 1 for the sake of convenience, such a clear boundary 63 does not exist in the actual second wiring conductor 6, and a plurality of voids 64 are located at the boundary 63 as illustrated in FIG. 2. The first portion 61 and the second portion 62 are separated by the voids 64. FIG. 2 is a photograph obtained by an electron microscope showing a region X illustrated in FIG. 1.

As described above, the second wiring conductor 6 includes the first portion 61 and the second portion 62, and the plurality of voids 64 are located at the boundary 63 between the first portion 61 and the second portion 62. Accordingly, stress generated between the second wiring conductor 6 and the insulation layer 1, and stress generated in the second wiring conductor 6 are dispersed and alleviated at the boundary 63, between the first portion 61 and the second portion 62, at which the voids 64 are located. As a result, the wiring board according to the embodiment can reduce the peeling of the second wiring conductor 6.

The maximum length of the void 64 is not limited, and may be, for example, in a range from 50 nm to 1 μm. In the present specification, the term "maximum length" refers to the length of the largest linear distance between the peripheral edges of the void 64. When the maximum length of the void 64 is in the range from 50 nm to 1 μm, the above-described stress can be sufficiently dispersed and alleviated without affecting the bonding strength between the first portion 61 and the second portion 62.

At least a part of the first portion 61 and the second portion 62 located with the boundary 63 interposed therebetween includes a continuous crystal. The continuous crystal means that the crystal orientation of the first electrolytic plating metal constituting the first portion 61 and the crystal orientation of the second electrolytic plating metal constituting the second portion coincide with each other on either side of the boundary 63.

The arithmetic mean roughness Ra of the inner surface of the recessed portion 3 is not limited, and may be, for example, in a range from 50 nm to 100 nm. When the arithmetic mean roughness Ra of the inner surface of the recessed portion 3 is in a range from 50 nm to 100 nm, the underlying metal layer 4 is more firmly adhered to the recessed portion 3, and the peeling of the underlying metal layer 4 can be further reduced.

The arithmetic mean roughness Ra of the surface of the underlying metal layer 4 located in the recessed portion 3 is not limited, and may be, for example, in a range from 50 nm to 100 nm. When the arithmetic mean roughness Ra of the surface of the underlying metal layer 4 located in the recessed portion 3 is in a range from 50 nm to 100 nm, the second wiring conductor 6 is firmly adhered to the underlying metal layer 4, and the peeling of the second wiring conductor 6 can be further reduced. The arithmetic mean roughness Ra of the second wiring conductor 6 may be in a range from 50 nm to 100 nm corresponding to the arithmetic mean roughness Ra of the surface of the underlying metal layer 4.

A solder resist 7 may be located at an outermost layer of the wiring board 10 according to the embodiment. The solder resist 7 is made of, for example, an acrylic-modified epoxy resin. The solder resist 7 has a function of protecting the conductor layers (the first wiring conductor 5 and the second wiring conductor 6) and the like from solder, for example, when an electronic component is mounted or connected to a motherboard or the like. The solder resist 7 has an opening portion for exposing a part of the first wiring conductor 5 or the second wiring conductor 6 located immediately below the solder resist 7. The part of the first wiring conductor 5 or the second wiring conductor 6 exposed from the opening portion functions as a pad when mounting a semiconductor element or the like.

A manufacturing method for the wiring board according to the present disclosure will be described with reference to FIGS. 3 to 12. FIGS. 3 to 12 are explanatory diagrams illustrating manufacturing steps for the first wiring conductor and the second wiring conductor, in the manufacturing method for the wiring board according to the embodiment of the present disclosure. The manufacturing method for the wiring board according to the present disclosure includes the following steps (a) to (g).

(a) Forming a groove and a recessed portion having a width wider than the groove at the upper surface of an insulation layer.

(b) Forming an underlying metal layer on the upper surface of the insulation layer, the inner surface of the groove, and the inner surface of the recessed portion.

(c) Forming at least one plating resist having a width narrower than the width of the recessed portion, on the underlying metal layer in the recessed portion.

(d) Forming a first electrolytic plating layer on the underlying metal layer exposed from the plating resist.

(e) Removing the plating resist from on top of the underlying metal layer.

(f) Forming a second electrolytic plating layer on the first electrolytic plating layer and on the underlying metal layer.

(g) Removing portions of the first electrolytic plating layer, the second electrolytic plating layer, and the underlying metal layer to form a first wiring conductor that fills the groove and is made of a first electrolytic plating metal derived from the first electrolytic plating layer or a second electrolytic plating metal derived from the second electrolytic plating layer, and a second wiring conductor that fills the recessed portion and is made of the first electrolytic plating metal derived from the first electrolytic plating layer and the second electrolytic plating metal derived from the second electrolytic plating layer.

Figure 3:
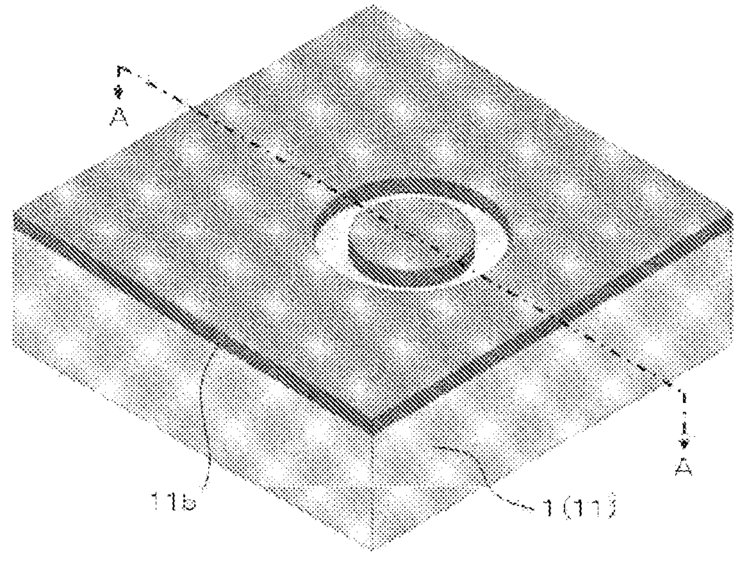
FIG. 3 is an explanatory diagram illustrating a manufacturing step for a wiring conductor, in a manufacturing method for the wiring board according to the embodiment of the present disclosure.
Figure 3:
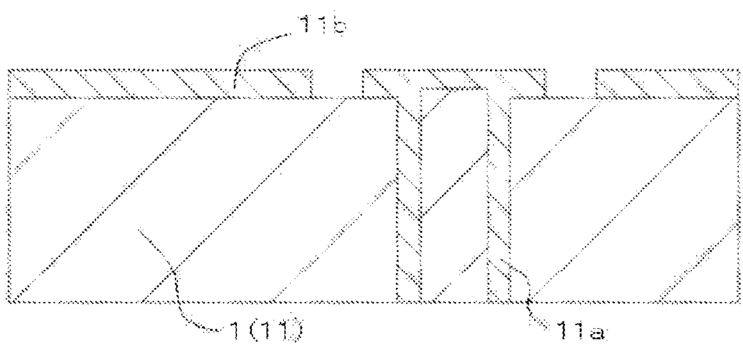

First, as illustrated in FIG. 3, the insulation layer 1 (core insulation layer 11) is prepared. The conductor layer **11*b* is formed at the upper surface of the core insulation layer 11, and the through-hole conductor 11*a* is formed at the core insulation layer 11. The through-hole conductor 11*a* is connected to a part of the conductor layer 11*b* formed at the upper surface of the core insulation layer 11. The core insulation layer 11, the through-hole conductor 11*a*, and the conductor layer 11*b* are as described above, and detailed description thereof is thus omitted here. The diagram in the lower part of FIG. 3 is a cross-sectional view taken along a line A-A illustrated in the upper part of FIG. 3. Hereinafter, the diagrams illustrated in the lower part of FIGS. 4 to 12** are cross-sectional views taken along the line A-A illustrated in the upper part thereof, respectively.

Figure 4:
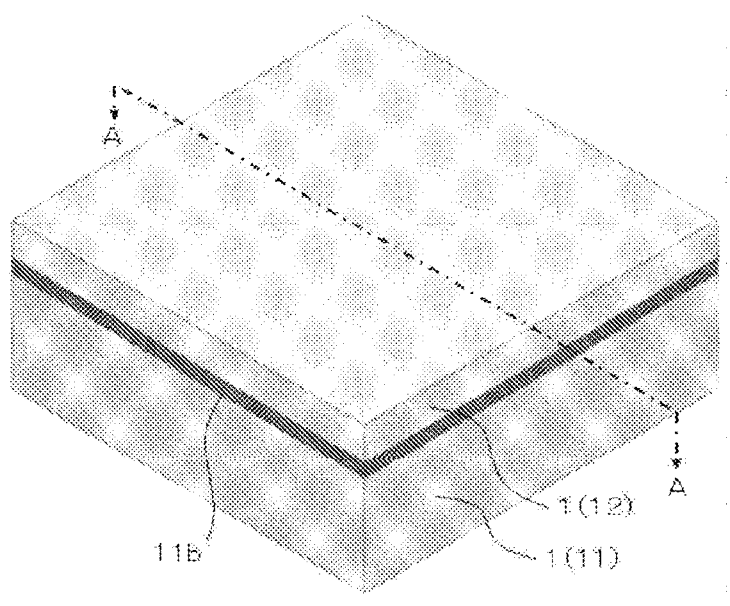
FIG. 4 is an explanatory diagram illustrating a manufacturing step for the wiring conductor, in the manufacturing method for the wiring board according to the embodiment of the present disclosure.
Figure 4:
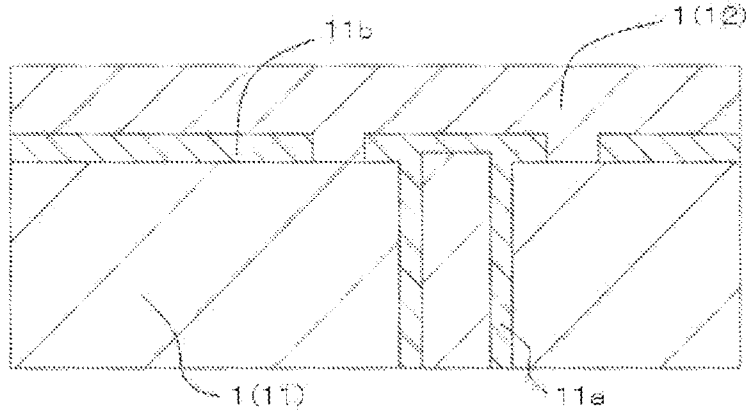

Subsequently, as illustrated in FIG. 4, the insulation layer 1 (build-up insulation layer 12) is layered so as to cover the core insulation layer 11 and the conductor layer **11*b*. The build-up insulation layer 12** is as described above, and detailed description thereof is thus omitted here.

Figure 5:
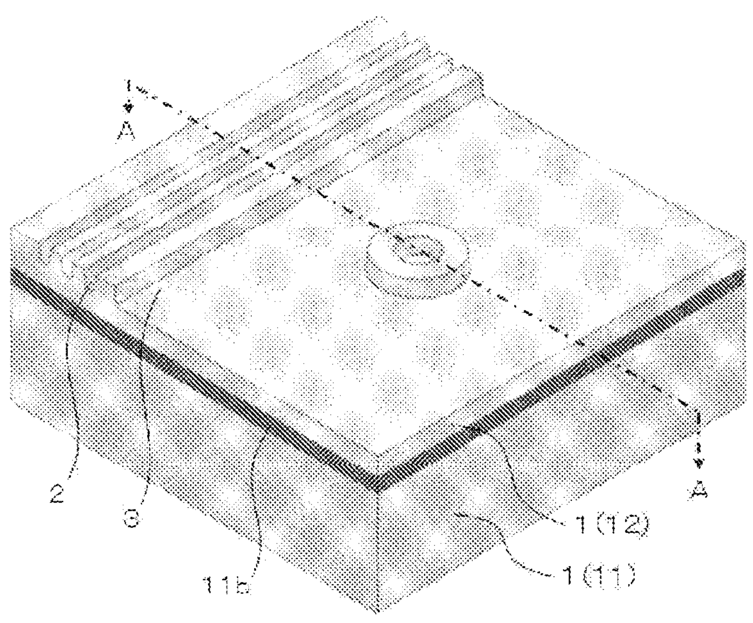
FIG. 5 is an explanatory diagram illustrating a manufacturing step for the first wiring conductor and the second wiring conductor, in the manufacturing method for the wiring board according to the embodiment of the present disclosure.
Figure 5:
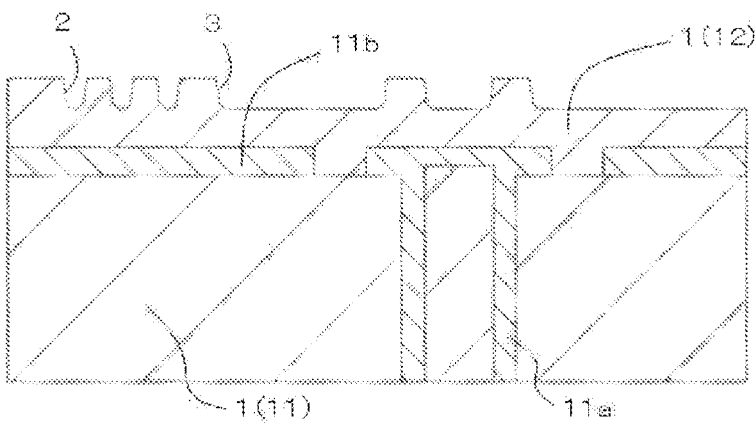

Subsequently, as illustrated in FIG. 5, the groove 2 and the recessed portion 3 having a width wider than groove 2 are formed at the upper surface of the insulation layer 1 (build-up insulation layer 12) (step (a)). As illustrated in FIG. 5, it is sufficient that the groove 2 be formed at a position at which the first wiring conductor 5 is formed. A method for forming the groove 2 is not limited, and the groove 2 is formed by a laser machining process using an excimer laser, a $CO_2$ laser, a UV-YAG laser, or the like. From the viewpoint of ease of forming the groove 2 having a uniform depth, it is preferable to employ an excimer laser. The depth of the groove 2 is as described above, and detailed description thereof is thus omitted here.

The arithmetic mean roughness Ra of the inner surface of the groove 2 is not limited. The inner surface of the groove 2 may be subjected to a roughening treatment if necessary, so that the arithmetic mean roughness Ra of the inner surface of the groove 2 is, for example, in a range from 50 nm to 100 nm. Detailed description thereof is as described above, and it is thus omitted here.

It is sufficient that the recessed portion 3 be formed at a position at which the second wiring conductor 6 is formed. The method for forming the recessed portion 3 is not limited, and the recessed portion 3 is formed by a laser machining process using an excimer laser, a $CO_2$ laser, a UV-YAG laser, or the like. From the viewpoint of ease of forming the recessed portion 3 having a uniform depth, it is preferable to employ an excimer laser. The depth of the recessed portion 3 is as described above, and detailed description thereof is thus omitted here.

The arithmetic mean roughness Ra of the inner surface of the recessed portion 3 is not limited. The inner surface of the recessed portion 3 may be subjected to a roughening treatment if necessary, so that the arithmetic mean roughness Ra of the inner surface of the recessed portion 3 is, for example, in a range from 50 nm to 100 nm. Detailed description thereof is as described above, and it is thus omitted here.

Figure 6:
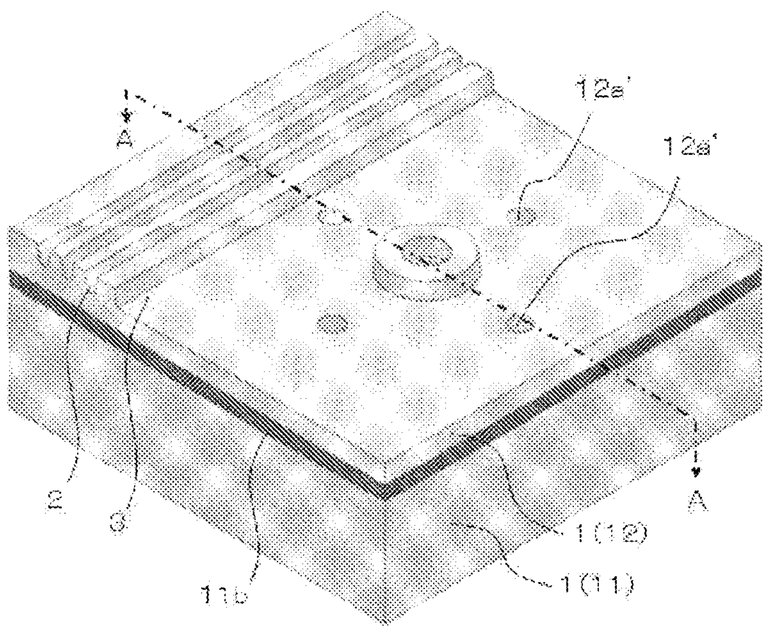
FIG. 6 is an explanatory diagram illustrating a manufacturing step for the first wiring conductor and the second wiring conductor, in the manufacturing method for the wiring board according to the embodiment of the present disclosure.
Figure 6:
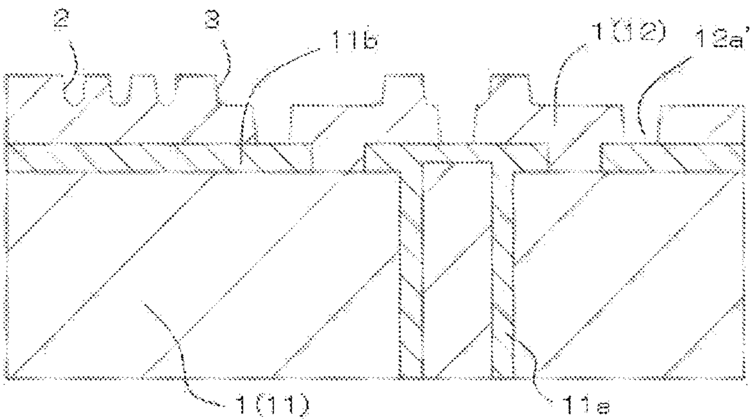

Subsequently, as illustrated in FIG. 6, the via hole 12*a* is formed at the build-up insulation layer 12. The via hole 12*a* is formed by a laser machining process using an excimer laser, a $CO_2$ laser, a UV-YAG laser, or the like.

Figure 7:
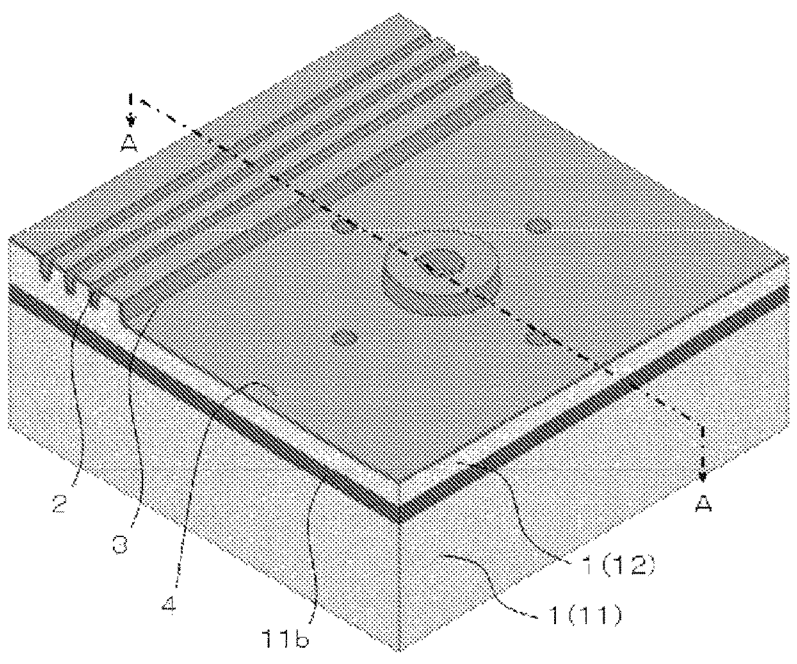
FIG. 7 is an explanatory diagram illustrating a manufacturing step for the first wiring conductor and the second wiring conductor, in the manufacturing method for the wiring board according to the embodiment of the present disclosure.
Figure 7:
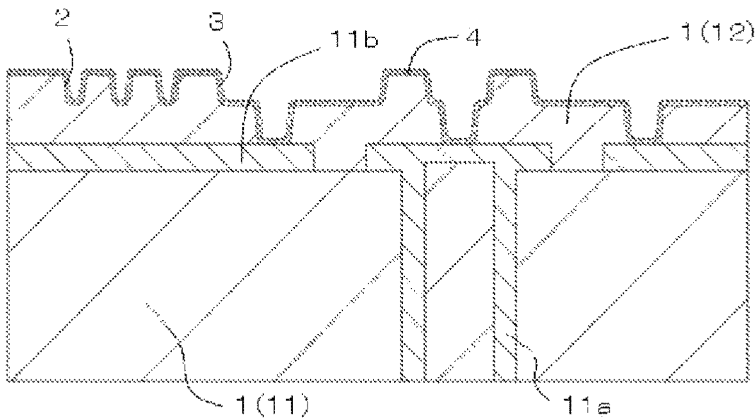

Subsequently, as illustrated in FIG. 7, the underlying metal layer 4 is formed at the upper surface of the insulation layer 1, the inner surface of the groove 2, and the inner surface of the recessed portion 3 (step (b)). The underlying metal layer 4 is formed, for example, by depositing a metal such as copper through electroless plating. When performing the electroless plating, palladium may be used as a catalyst. The underlying metal layer 4 has a thickness in a range from 0.1 μm to 0.5 μm, for example.

The arithmetic mean roughness Ra of the surface of the underlying metal layer 4 located in the groove 2 is not limited. The surface of the underlying metal layer 4 located in the groove 2 may be subjected to a roughening treatment if necessary, so that the arithmetic mean roughness Ra of the surface of the underlying metal layer 4 located in the groove 2 is, for example, in a range from 50 nm to 100 nm. Detailed description thereof is as described above, and it is thus omitted here.

The arithmetic mean roughness Ra of the surface of the underlying metal layer 4 located in the recessed portion 3 is not limited. The surface of the underlying metal layer 4 located in the recessed portion 3 may be subjected to a roughening treatment if necessary, so that the arithmetic mean roughness Ra of the surface of the underlying metal layer 4 located in the recessed portion 3 is, for example, in a range from 50 nm to 100 nm. Detailed description thereof is as described above, and it is thus omitted here.

Figure 8:
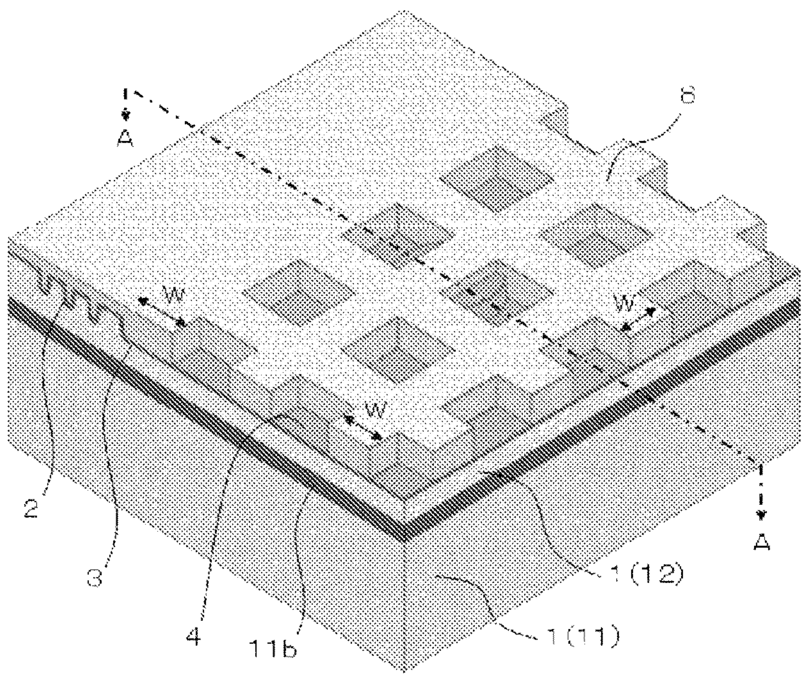
FIG. 8 is an explanatory diagram illustrating a manufacturing step for the first wiring conductor and the second wiring conductor, in the manufacturing method for the wiring board according to the embodiment of the present disclosure.
Figure 8:
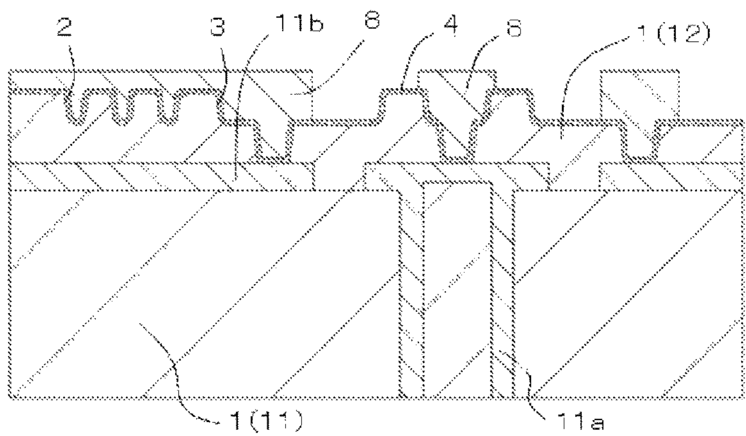

Subsequently, as illustrated in FIG. 8, at least one plating resist 8 having a width W narrower than the width of the recessed portion 3 is formed on the underlying metal layer 4 in the recessed portion 3 (step (c)). The width W of the plating resist 8 is not limited as long as it is narrower than the width of the recessed portion 3, and may be, for example, in a range from 50 μm to 100 μm. As long as the plating resist 8 having the width W narrower than the width of the recessed portion 3 is formed in the recessed portion 3, the plating resist 8 may be formed, for example, so as to cover other portions such as the groove 2. The plating resist 8 is made of, for example, a resin such as an acrylic resin or a methacrylic resin.

Figure 9:
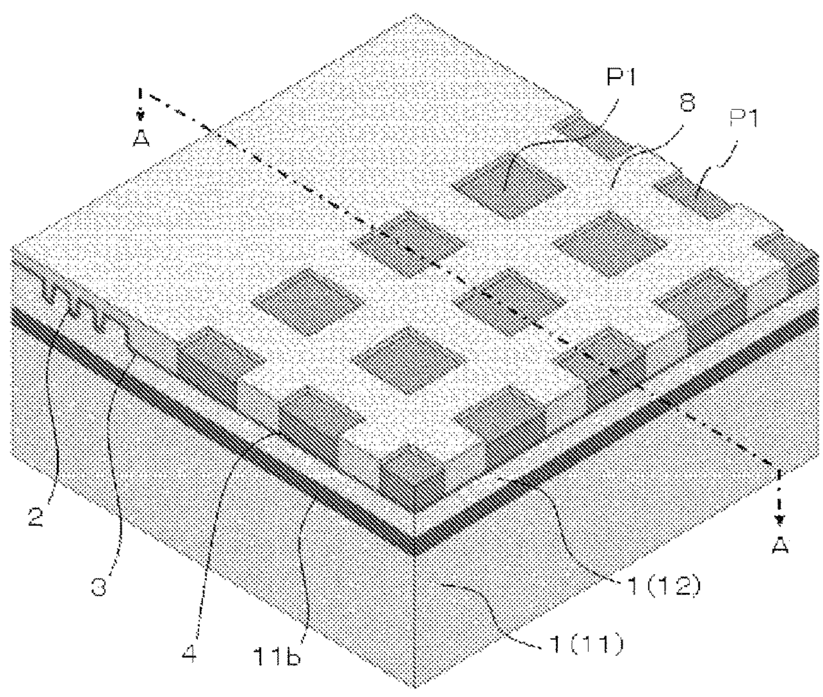
FIG. 9 is an explanatory diagram illustrating a manufacturing step for the first wiring conductor and the second wiring conductor, in the manufacturing method for the wiring board according to the embodiment of the present disclosure.
Figure 9:
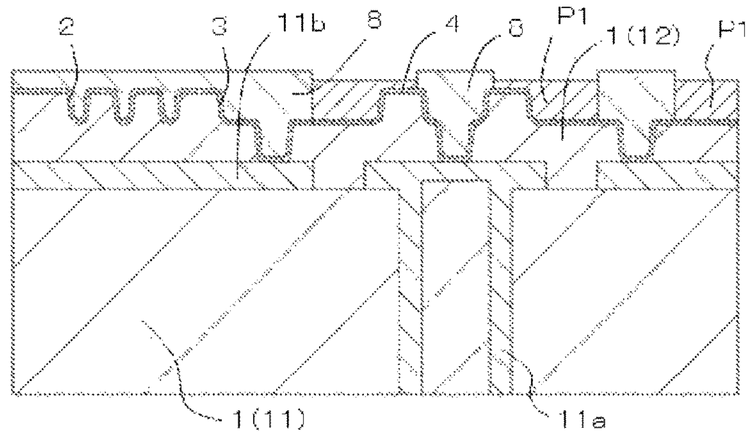

Subsequently, as illustrated in FIG. 9, a first electrolytic plating layer P1 is formed on the underlying metal layer 4 exposed from the plating resist 8 (step (d)). The first electrolytic plating layer P1 is formed, for example, by depositing a metal such as copper through electrolytic plating.

Figure 10:
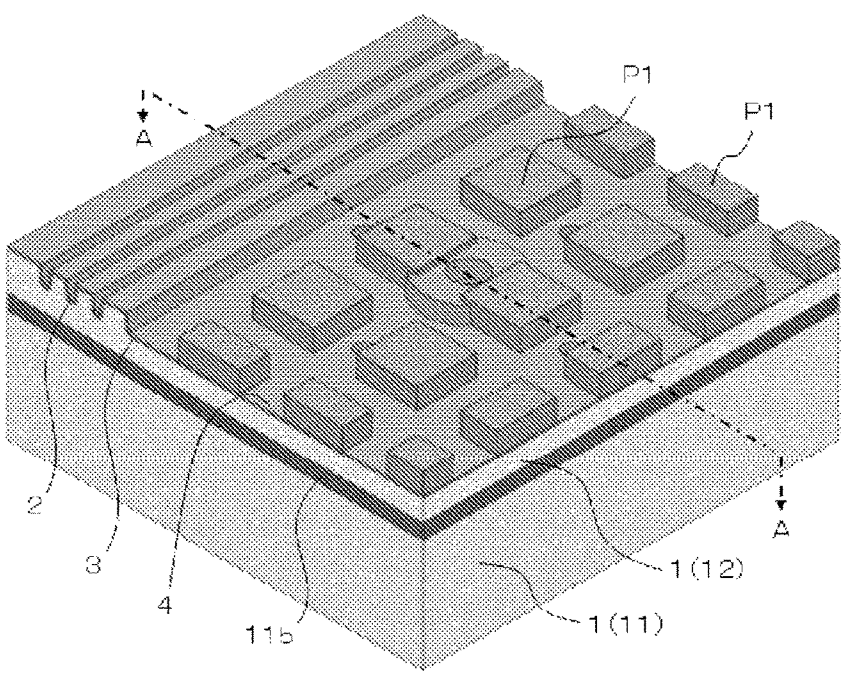
FIG. 10 is an explanatory diagram illustrating a manufacturing step for the first wiring conductor and the second wiring conductor, in the manufacturing method for the wiring board according to the embodiment of the present disclosure.
Figure 10:
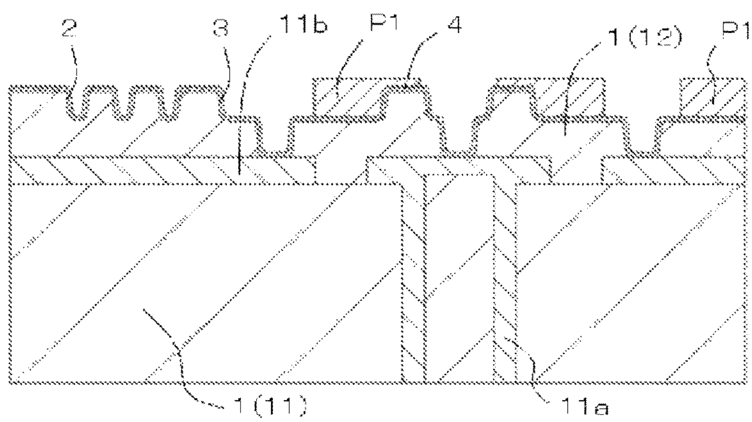

Subsequently, as illustrated in FIG. 10, the plating resist 8 is removed from on top of the underlying metal layer 4 (step (e)). By removing the plating resist 8, the underlying metal layer 4 is exposed in the recessed portion 3 except for a portion thereof at which the first electrolytic plating layer P1 is located.

Figure 11:
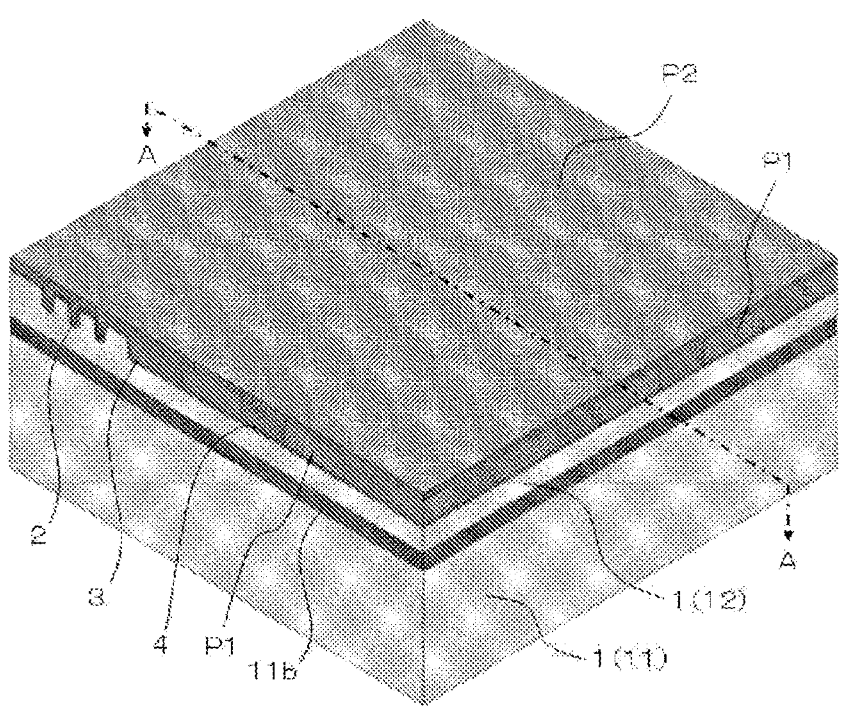
FIG. 11 is an explanatory diagram illustrating a manufacturing step for the first wiring conductor and the second wiring conductor, in the manufacturing method for the wiring board according to the embodiment of the present disclosure.
Figure 11:
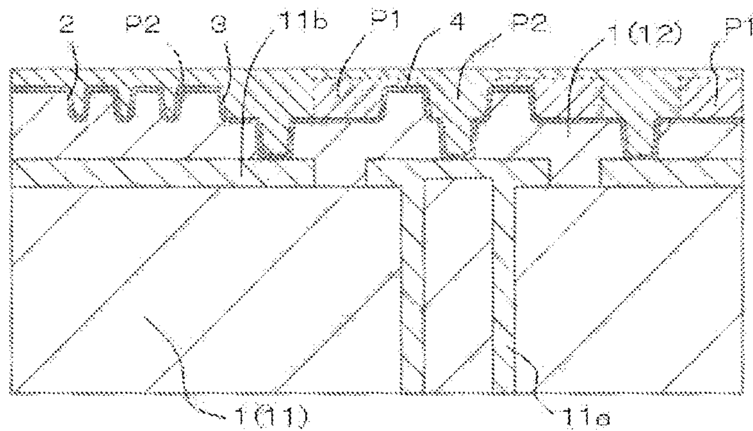

Subsequently, as illustrated in FIG. 11, a second electrolytic plating layer P2 is formed on the first electrolytic plating layer P1 and on the underlying metal layer 4 (step (f)). Specifically, the second electrolytic plating layer P2 is formed on the first electrolytic plating layer P1 formed in the recessed portion 3, and on a portion of the underlying metal layer 4 at which it is exposed as a result of removing the plating resist 8 in the groove 2 and the recessed portion 3. The second electrolytic plating layer P2 is formed, for example, by depositing a metal such as copper through electrolytic plating. The second electrolytic plating layer P2 is formed so that, for example, the recessed portion 3 is filled with a metal such as copper.

Figure 12:
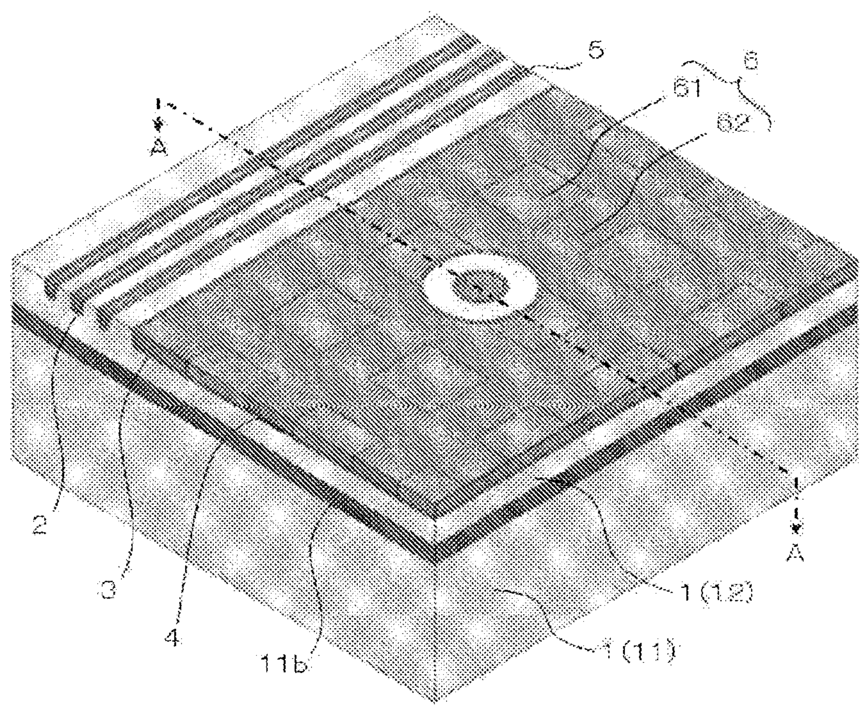
FIG. 12 is an explanatory diagram illustrating a manufacturing step for the first wiring conductor and the second wiring conductor, in the manufacturing method for the wiring board according to the embodiment of the present disclosure.
Figure 12:
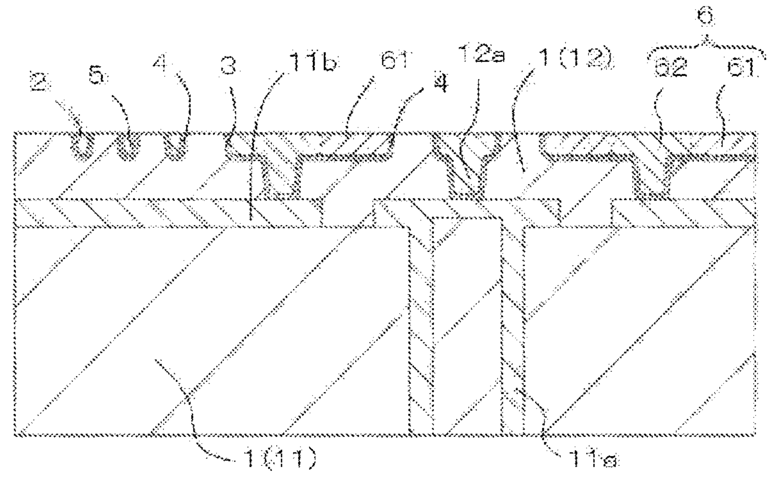

Subsequently, as illustrated in FIG. 12, portions of the first electrolytic plating layer P1, the second electrolytic plating layer P2, and the underlying metal layer 4 are removed to form the first wiring conductor 5 that fills the groove 2 and is made of a second electrolytic plating metal derived from the second electrolytic plating layer P2, and the second wiring conductor 6 that fills the recessed portion 3 and is made of a first electrolytic plating metal derived from the first electrolytic plating layer P1 and the second electrolytic plating metal derived from the second electrolytic plating layer P2 (step (g)).

Examples of a method for removing the portions of the first electrolytic plating layer P1, the second electrolytic plating layer P2, and the underlying metal layer 4 include chemical mechanical polishing. By removing the portions of the first electrolytic plating layer P1, the second electrolytic plating layer P2, and the underlying metal layer 4, the surface of the first wiring conductor 5 and the surface of the second wiring conductor 6 are made substantially flush with each other. In the second wiring conductor 6, the first electrolytic plating metal corresponds to the first portion 61, and the second electrolytic plating metal corresponds to the second portion 62.

In FIG. 12, for the sake of convenience, the first portion 61 and the second portion 62 are clearly distinguished from each other. However, in actuality, there is no clear boundary between the first portion 61 and the second portion 62 as described above, and the plurality of voids 64 are located at the boundary 63 as illustrated in FIG. 2. The first portion 61 and the second portion 62 are separated by the voids 64.

In this way, the first wiring conductor 5 and the second wiring conductor 6 are formed at the insulation layer 1 such as a core insulation layer or a build-up insulation layer, and the wiring board according to the present disclosure is obtained. When the insulation layer 1 is a build-up insulation layer, a desired number of build-up insulation layers can be formed by repeating the above-described steps (a) to (g). In the wiring board according to the present disclosure, the solder resist 7 may be located at the outermost layer. The solder resist 7 is as described above, and detailed description thereof is thus omitted here.

In the above-described method for manufacturing the wiring board according to the embodiment, at step (c), the plating resist 8 is formed on the underlying metal layer 4 in the recessed portion 3 so as to have a lattice shape when viewed in a top surface view. However, the plating resist 8 formed on the underlying metal layer 4 in the recessed portion 3 is not limited to having the lattice shape.

Figure 13:
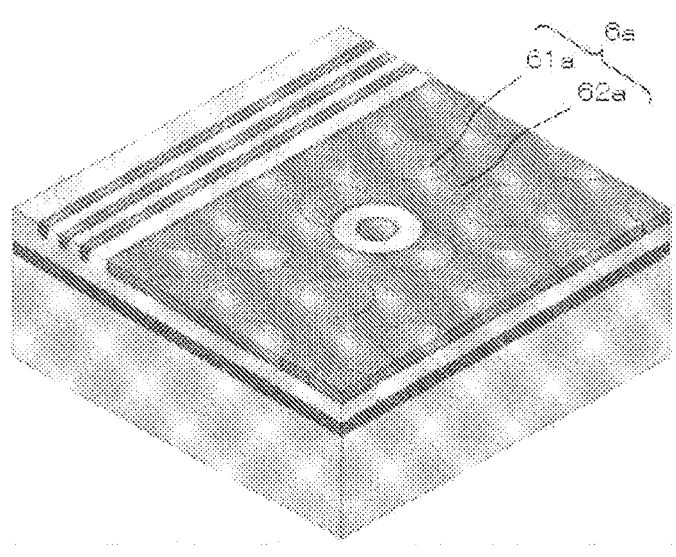
FIG. 13 is an explanatory diagram illustrating a variation of the second wiring conductor.

Although similar to the lattice shape illustrated in FIG. 8, the plating resist may be formed on the underlying metal layer in the recessed portion so as to be hollowed out in a circular shape instead of a quadrangular shape when viewed in a top surface view. When the plating resist is formed so as to be hollowed out in the circular shape in this manner, a second wiring conductor 6*a* including a first portion 61*a* and a second portion 62*a* as illustrated in FIG. 13 is formed.

Alternatively, contrary to the lattice shape, a structure (so-called sea-island structure) may be employed in which the plating resist remains in a portion hollowed out in a quadrangular shape or a circular shape, and the plating resist is not present in a lattice-shaped portion when viewed in a top surface view. When the plating resist is present in a shape corresponding to the sea-island structure, the first portions 61, 61*a* and the second portions 62, 62*a* of the second wiring conductors 6, 6*a* are reversed in FIGS. 12 and 13, respectively.

Figure 14:
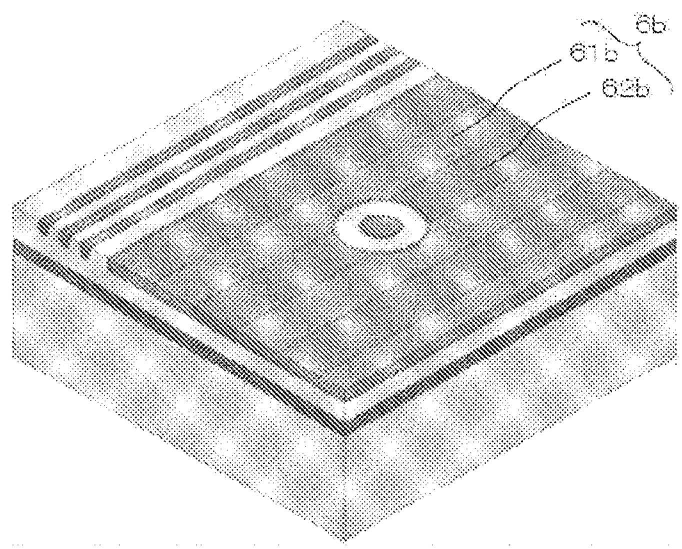
FIG. 14 is an explanatory diagram illustrating a variation of the second wiring conductor.

The plating resist need not necessarily intersect vertically and horizontally when viewed in a top surface view, and the plating resist may have a linear shape. When the plating resist formed on the underlying metal layer in the recessed portion is formed in a linear shape, a second wiring conductor 6*b* including a first portion 61*b* and a second portion 62*b* as illustrated in FIG. 14 is formed.

Figure 15:
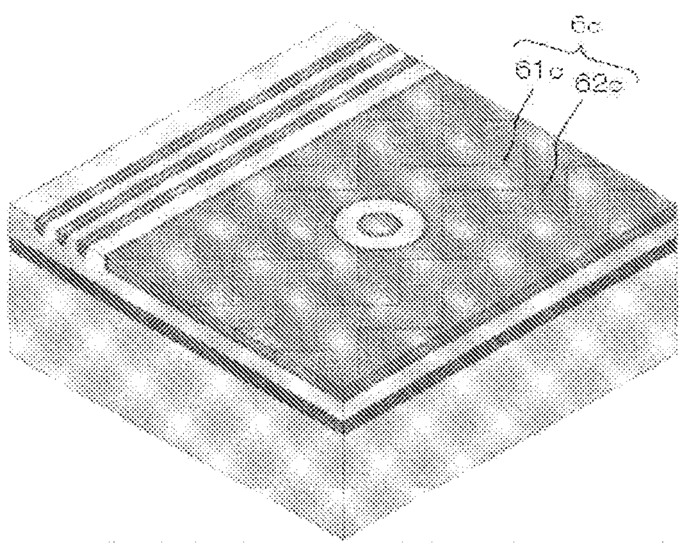
FIG. 15 is an explanatory diagram illustrating a variation of the second wiring conductor.
Figure 16:
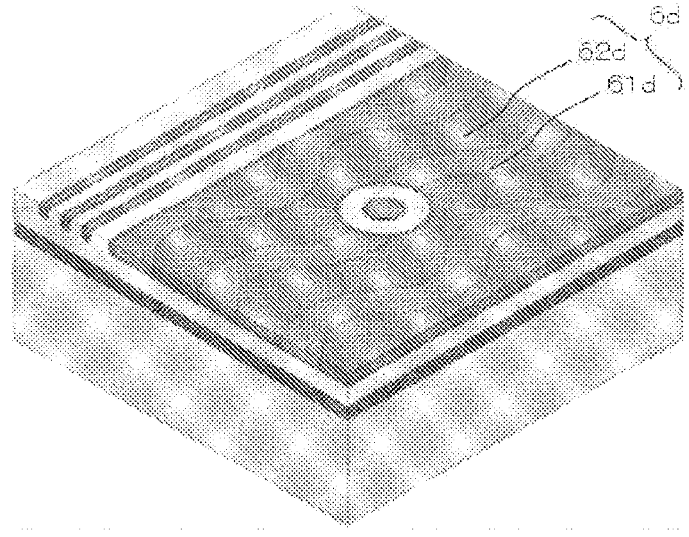
FIG. 16 is an explanatory diagram illustrating a variation of the second wiring conductor.

Alternatively, the plating resist formed on the underlying metal layer in the recessed portion may have a polygonal line shape such as a mountain shape or a curved line shape such as a wave shape when viewed in a top surface view, in addition to the linear shape. When the plating resist formed on the underlying metal layer in the recessed portion is formed in a mountain shape, a second wiring conductor 6*c* including a first portion 61*c* and a second portion 62*c* as illustrated in FIG. 15 is formed. When the plating resist formed on the underlying metal layer in the recessed portion is formed in a wave shape, a second wiring conductor 6*d* including a first portion 61*d* and a second portion 62*d* as illustrated in FIG. 16 is formed.

As illustrated in FIG. 8, in the above-described embodiment, the plating resist 8 is also formed at a portion other than the recessed portion 3. Specifically, in FIG. 8, the plating resist 8 is also formed so as to cover the groove 2. However, the plating resist 8 may be formed only in the recessed portion 3. In this case, the groove is filled with the first electrolytic plating layer, and the first wiring conductor is made of the first electrolytic plating metal derived from the first electrolytic plating layer.

REFERENCE SIGNS

1 Insulation layer
11 Core insulation layer
11*a* Through-hole conductor
11*b* Conductor layer
12 Build-up insulation layer
12*a* Via-hole conductor
12*a*' Via hole
2 Groove
3 Recessed portion
4 Underlying metal layer
5 First wiring conductor
6 Second wiring conductor
61 First portion
62 Second portion
63 Boundary
64 Void
7 Solder resist
8 Plating resist
10 Wiring board
P1 First electrolytic plating layer
P2 Second electrolytic plating layer

The invention claimed is:

1. A wiring board comprising:
an insulation layer;
a groove located at an upper surface of the insulation layer;
a recessed portion located at the upper surface of the insulation layer and having a width wider than the groove;
an underlying metal layer located at an inner surface of the groove and an inner surface of the recessed portion;
a first wiring conductor located on the underlying metal layer to fill the groove; and
a second wiring conductor located on the underlying metal layer to fill the recessed portion and having a width wider than the first wiring conductor, wherein
the second wiring conductor comprises a first portion and a second portion located adjacent to and integrally with the first portion, and
a plurality of voids each having a maximum length in a range from 50 nm to 1 μm are located at a boundary between the first portion and the second portion.

2. The wiring board according to claim 1, wherein
the first portion is a first electrolytic plating metal, and the second portion is a second electrolytic plating metal.

3. The wiring board according to claim 1, wherein
at least a part of the first portion and of the second portion located with the boundary interposed therebetween contains a continuous crystal.

4. The wiring board according claim 1, wherein
the first wiring conductor has a width of 15 μm or less.

5. The wiring board according to claim 1, wherein
the second wiring conductor has a width of 150 μm or more.

6. A manufacturing method for a wiring board, the manufacturing method comprising:
forming a groove and a recessed portion having a width wider than the groove, at an upper surface of an insulation layer;
forming an underlying metal layer at the upper surface of the insulation layer, an inner surface of the groove, and an inner surface of the recessed portion;
forming at least one plating resist having a width narrower than the width of the recessed portion, on the underlying metal layer in the recessed portion;
forming a first electrolytic plating layer on the underlying metal layer exposed from the plating resist;
removing the plating resist from on top of the underlying metal layer;
forming a second electrolytic plating layer on the first electrolytic plating layer and on the underlying metal layer; and
removing portions of the first electrolytic plating layer, the second electrolytic plating layer, and the underlying metal layer to form a first wiring conductor that fills the groove and is made of a first electrolytic plating metal derived from the first electrolytic plating layer or a second electrolytic plating metal derived from the second electrolytic plating layer, and a second wiring conductor that fills the recessed portion and is made of the first electrolytic plating metal derived from the first electrolytic plating layer and the second electrolytic plating metal derived from the second electrolytic plating layer, wherein the second wiring conductor comprises a first portion and a second portion located adjacent to and integrally with the first portion, and a plurality of voids each having a maximum length in a range from 50 nm to 1 μm are located at a boundary between the first portion and the second portion.

7. The manufacturing method for the wiring board according to claim 6, wherein
the plating resist has a width in a range from 50 μm to 100 μm.

8. The manufacturing method for the wiring board according to claim 6, wherein
the first wiring conductor has a width of 15 μm or less.

9. The manufacturing method for the wiring board-according to claim 6, wherein the second wiring conductor has a width of 150 μm or more.

* * * * *